United States Patent
Lin et al.

(10) Patent No.: US 10,483,938 B2
(45) Date of Patent: Nov. 19, 2019

(54) TUNABLE FILTER

(71) Applicant: NATIONAL TAIWAN UNIVERSITY, Taipei (TW)

(72) Inventors: Chia-Chia Lin, Kaohsiung (TW); Han-Yun Tsai, Taoyuan (TW); Ruey-Beei Wu, Taipei (TW)

(73) Assignee: NATIONAL TAIWAN UNIVERSITY, Taipei (TW)

( * ) Notice: Subject to any disclaimer, the term of this patent is extended or adjusted under 35 U.S.C. 154(b) by 0 days.

(21) Appl. No.: 15/871,240

(22) Filed: Jan. 15, 2018

(65) Prior Publication Data
US 2019/0115897 A1   Apr. 18, 2019

(30) Foreign Application Priority Data
Oct. 16, 2017  (TW) .............................. 106135316 A

(51) Int. Cl.
| | |
|---|---|
| *H03H 7/12* | (2006.01) |
| *H03H 7/01* | (2006.01) |
| *H01P 1/203* | (2006.01) |
| *H03H 1/00* | (2006.01) |

(52) U.S. Cl.
CPC .............. *H03H 7/12* (2013.01); *H01P 1/203* (2013.01); *H03H 7/0115* (2013.01); *H03H 2001/0085* (2013.01); *H03H 2210/025* (2013.01)

(58) Field of Classification Search
CPC ........ H01P 1/203; H03H 7/0115; H03H 7/09; H03H 7/427; H03H 2001/0085; H03H 7/1766; H03H 7/12
USPC ......................................... 333/185, 175–177
See application file for complete search history.

(56) References Cited

U.S. PATENT DOCUMENTS

| | | | | |
|---|---|---|---|---|
| 6,294,967 B1* | 9/2001 | Hirai | ................... | H01P 1/20345 333/202 |
| 7,782,157 B2* | 8/2010 | Oshima | .................... | H01G 4/38 333/185 |
| 8,125,299 B2* | 2/2012 | Alkan | ...................... | H03H 1/00 333/175 |
| 2002/0093400 A1* | 7/2002 | Zhu | ...................... | H01P 1/20336 333/205 |
| 2004/0130414 A1* | 7/2004 | Marquardt | ........... | H03H 7/0161 333/174 |
| 2010/0073108 A1* | 3/2010 | Yamasita | ................ | H01P 1/203 333/204 |

\* cited by examiner

*Primary Examiner* — Rakesh B Patel
(74) *Attorney, Agent, or Firm* — Li & Cai Intellectual Property (USA) Office

(57) ABSTRACT

A tunable filter includes a first circuit and a second circuit. In both of them, the first inductor and the second inductor are connected in serial, and further connected with the first capacitor in parallel. The first end of the second capacitor is connected between the first inductor and the second inductor, and the second end of the second capacitor is grounded. The first end of the first capacitor of the first circuit is coupled to the input end of the tunable filter through a first coupling capacitor. The second end of the first capacitor of the first circuit is coupled to the first end of the first capacitor of the second circuit through a second coupling capacitor. The second end of the first capacitor of the second circuit is coupled to the output end of the tunable filter through a third coupling capacitor.

6 Claims, 6 Drawing Sheets

US 10,483,938 B2

TUNABLE FILTER

BACKGROUND OF THE INVENTION

1. Field of the Invention

The present disclosure relates to a tunable filter; in particular, to a T-type tunable filter adapted for the Integrated Fan-Out Wafer Level Packaging (InFO-WLP) technology.

2. Description of Related Art

Filters are essential elements in the circuit design of RF front-end circuits in the wireless communication technology. More data throughput and faster data transmission speed are required, so that more filters need to be used in a multi-channel and multi-band communication system. As a result, the circuit area and circuit complexity thereof are increased. In order to have a smaller circuit area and reduced circuit complexity, the filters are usually integrated or designed as a tunable filter.

Additionally, since the wireless communication devices are now required to weigh less and have a smaller volume, the Integrated Fan-Out Wafer Level Packaging (InFO-WLP) technology is preferred because it provides the products with better performance, higher density, better heat dissipation, higher reliability, less thickness, less loss, and less cost.

SUMMARY OF THE INVENTION

The present disclosure provides a tunable filter. The tunable filter has an input end and an output end, and includes a first circuit and a second circuit. Both of the first circuit and the second circuit include a first capacitor, a second capacitor, a first inductor and a second inductor. The first capacitor has a first end and a second end. The first inductor and the second inductor are connected in serial, and are further connected with the first capacitor in parallel. A mutual induction is generated between the first inductor and the second inductor. The second capacitor has a first end and a second end. The first end of the second capacitor is connected between the first inductor and the second inductor, and the second end of the second capacitor is grounded. The first end of the first capacitor of the first circuit is coupled to the input end of the tunable filter through a first coupling capacitor. The second end of the first capacitor of the first circuit is coupled to the first end of the first capacitor of the second circuit through a second coupling capacitor. The second end of the first capacitor of the second circuit is coupled to the output end of the tunable filter through a third coupling capacitor.

In one embodiment of the tunable filter provided by the present disclosure, the first capacitor and the second capacitor of the first circuit are variable capacitors, and the first capacitor and the second capacitor of the second circuit are also variable capacitors. In addition, the first coupling capacitor, the second coupling capacitor and the third coupling capacitor are also variable capacitors.

In one embodiment of the tunable filter provided by the present disclosure, the tunable filter is configured on multi-layered substrates. The input end and the output end of the tunable filter, the first capacitor, the second capacitor, the first inductor and the second inductor of the first circuit, the first capacitor, the second capacitor, the first inductor and the second inductor of the second circuit, the first coupling capacitor, the second coupling capacitor and the third coupling capacitor are configured on the multi-layered substrates.

In the tunable filter provided by the present disclosure, the first capacitor and the second capacitor of the first circuit are variable capacitors, and the first capacitor and the second capacitor of the second circuit are also variable capacitors. In addition, the first coupling capacitor, the second coupling capacitor and the third coupling capacitor are variable capacitors. Therefore, the center frequency of the tunable filter provided by the present disclosure can be adjusted within a larger frequency range, and the quality factor and the bandwidth of the tunable filter provided by the present disclosure can be compensated and adjusted.

For further understanding of the present disclosure, reference is made to the following detailed description illustrating the embodiments of the present disclosure. The description is only for illustrating the present disclosure, and should not be construed as limiting the scope of the claim.

BRIEF DESCRIPTION OF THE DRAWINGS

Embodiments are illustrated by way of example and not by way of limitation in the figures of the accompanying drawings, in which like references indicate similar elements and in which.

DETAILED DESCRIPTION OF EXEMPLARY EMBODIMENTS

The aforementioned illustrations and following detailed descriptions are exemplary for the purpose of further explaining the scope of the present disclosure. Other objectives and advantages related to the present disclosure will be illustrated in the subsequent descriptions and appended drawings. In these drawings, like references indicate similar elements.

It will be understood that, although the terms first, second, third, and the like, may be used herein to describe various elements, these elements should not be limited by these terms. These terms are only to distinguish one element from another element, and the first element discussed below could be termed a second element without departing from the teachings of the instant disclosure. As used herein, the term "and/or" includes any and all combinations of one or more of the associated listed items.

Figure 1:
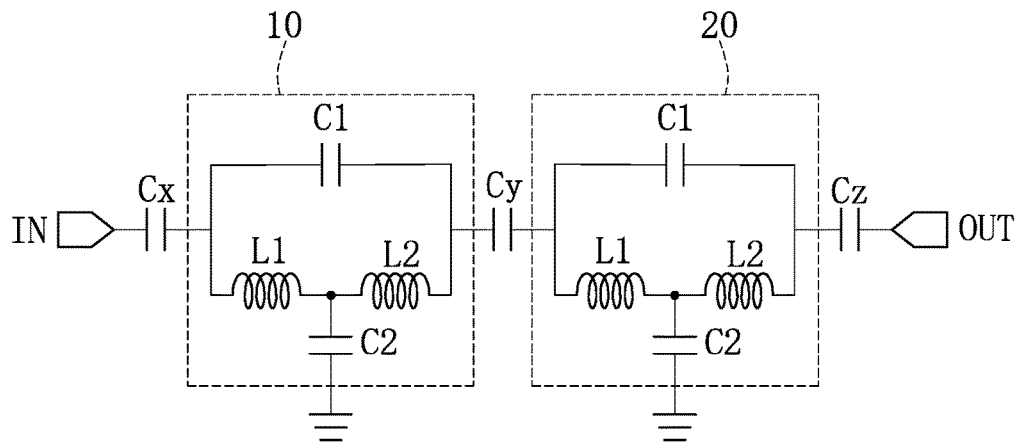
FIG. 1 shows a circuit diagram of a tunable filter according to one embodiment of the present disclosure.

The circuit structure of the tunable filter according to an embodiment of the present disclosure is described in the following descriptions. Referring to FIG. 1, a circuit diagram of a tunable filter according to one embodiment of the present disclosure is shown.

As shown in FIG. 1, the tunable filter in this embodiment has an input end IN and an output end OUT. In addition, the tunable filter includes a first circuit 10 and a second circuit 20. The first circuit 10 and the second circuit 20 both include a first capacitor C1, a second capacitor C2, a first inductor L1 and a second inductor L2.

In the first circuit 10, the first inductor L1 and the second inductor L2 are connected in serial, and they are further connected to the first capacitor C1 in parallel. Additionally, the first end of the second capacitor C2 is connected between the first inductor L1 and the second inductor L2, and the second end of the second capacitor C2 is grounded. Likewise, in the second circuit 20, the first inductor L1 and the second inductor L2 are connected in serial, and they are further connected to the first capacitor C1 in parallel. Additionally, the first end of the second capacitor C2 is connected between the first inductor L1 and the second inductor L2, and the second end of the second capacitor C2 is grounded.

It should be noted that, in the first circuit 10, a mutual induction is generated between the first inductor L1 and the second inductor L2, and in the second circuit 20, a mutual induction is also generated between the first inductor L1 and the second inductor L2. The coefficient of the mutual induction between the first inductor L1 and the second inductor L2 of the first circuit 10 is 0.3~0.5, and the coefficient of the mutual induction between the first inductor L1 and the second inductor L2 of the second circuit 20 is also 0.3~0.5.

Moreover, in this embodiment, the first end of the first capacitor C1 of the first circuit 10 is coupled to the input end IN of the tunable filter through a first coupling capacitor Cx. The second end of the first capacitor C1 of the first circuit 10 is coupled to the first end of the first capacitor C1 of the second circuit 20 through a second coupling capacitor Cy. The second end of the first capacitor C1 of the second circuit 20 is coupled to the output end OUT of the tunable filter through a third coupling capacitor Cz.

Figure 2:
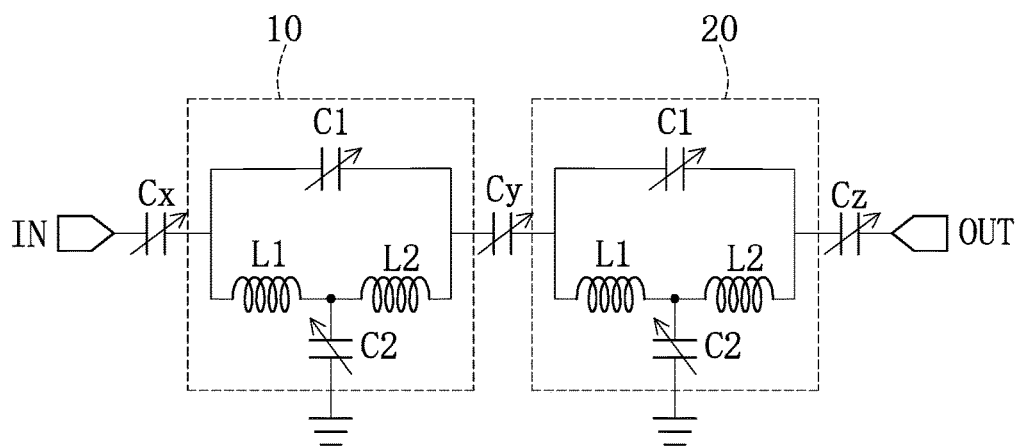
FIG. 2 shows another circuit diagram of a tunable filter according to one embodiment of the present disclosure.

In the following descriptions, how the center frequency of the tunable filter in this embodiment can be adjusted is illustrated. Referring to FIG. 2, a circuit diagram of a tunable filter according to one embodiment of the present disclosure is shown.

As shown in FIG. 2, to adjust the center frequency of the tunable filter, in this embodiment, the first capacitor C1 and the second capacitor C2 of the first circuit 10 are designed as variable capacitors, and the first capacitor C1 and the second capacitor C2 of the second circuit 20 are also designed as variable capacitors. By using variable capacitors as the first capacitor C1 and the second capacitor C2 of the first circuit 10 and the first capacitor C1 and the second capacitor C2 of the second circuit 20, the center frequency can be adjusted within a frequency range defined by 50% of the initial center frequency, such as 5 GHz~2.5 GHz or 2.5 GHz~1.25 GHz.

It is worth mentioning that, in other embodiments, variable capacitors can be connected externally respectively to the first capacitor C1 and the second capacitor C2 of the first circuit 10 and the first capacitor C1 and the second capacitor C2 of the second circuit 20, such that the capacitances of the first capacitor C1 and the second capacitor C2 of the first circuit 10 and the capacitances of the first capacitor C1 and the second capacitor C2 of the second circuit 20 can be tuned. However, the present disclosure is not limited thereto.

The center frequency of the tunable filter can be adjusted by tuning the capacitances of the first capacitor C1 and the second capacitor C2 of the first circuit 10 and tuning the capacitances of the first capacitor C1 and the second capacitor C2 of the second circuit 20. In other words, the capacitances of the first capacitor C1 and the second capacitor C2 of the first circuit 10 are relevant to the center frequency of the tunable filter, and the capacitances of the first capacitor C1 and the second capacitor C2 of the second circuit 20 are also relevant to the center frequency of the tunable filter. Specifically, the center frequency of the tunable filter can be adjusted by tuning the capacitance of only one of the first capacitor C1 and the second capacitor C2 of the first circuit 10 or by tuning the capacitances of both. In addition, the center frequency of the tunable filter can also be adjusted by tuning the capacitance of only one of the first capacitor C1 and the second capacitor C2 of the second circuit 20 or by tuning the capacitances of both.

Although the capacitances of the first capacitor C1 and the second capacitor C2 of the first circuit 10 and the capacitances of the first capacitor C1 and the second capacitor C2 of the second circuit 20 can be tuned for adjusting the center frequency of the tunable filter, in this embodiment, the ratio of the capacitance of the first capacitor C1 to the capacitance of the second capacitor C2 should be restricted to 0.08~0.12 in the first circuit 10, and the ratio of the capacitance of the first capacitor C1 to the capacitance of the second capacitor C2 should be restricted to 0.08~0.12 in the second circuit 20. Additionally, when the center frequency of the tunable filter needs to be adjusted only slightly, only one of the first capacitor C1 and the second capacitor C2 of the first circuit 10 needs to be tuned and only one of the first capacitor C1 and the second capacitor C2 of the second circuit 20 needs to be tuned. On the other hand, when the center frequency of the tunable filter needs to be adjusted considerably, the capacitances of both the first capacitor C1 and the second capacitor C2 of the first circuit 10 need to be tuned, and the capacitances of both the first capacitor C1 and the second capacitor C2 of the second circuit 20 also need to be tuned.

However, the quality factor of the tunable filter will vary after the capacitance of the first capacitor C1 of the first circuit 10 and the capacitance of the first capacitor C1 of the second circuit 20 are tuned for adjusting the center frequency of the tunable filter. In other words, tuning the capacitance of the first capacitor C1 of the first circuit 10 and the capacitance of the first capacitor C1 of the second circuit 20 causes more insertion loss of the tunable filter.

Figure 3A:
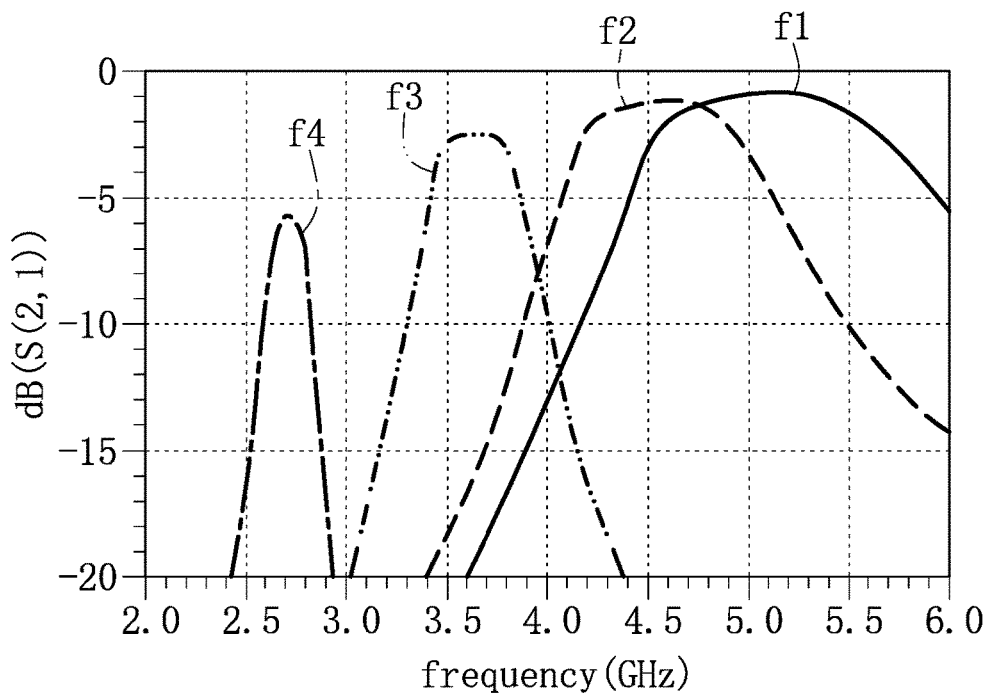
FIG. 3A and FIG. 3B show transmission characteristic of a tunable filter according to one embodiment of the present disclosure.
Figure 3B:
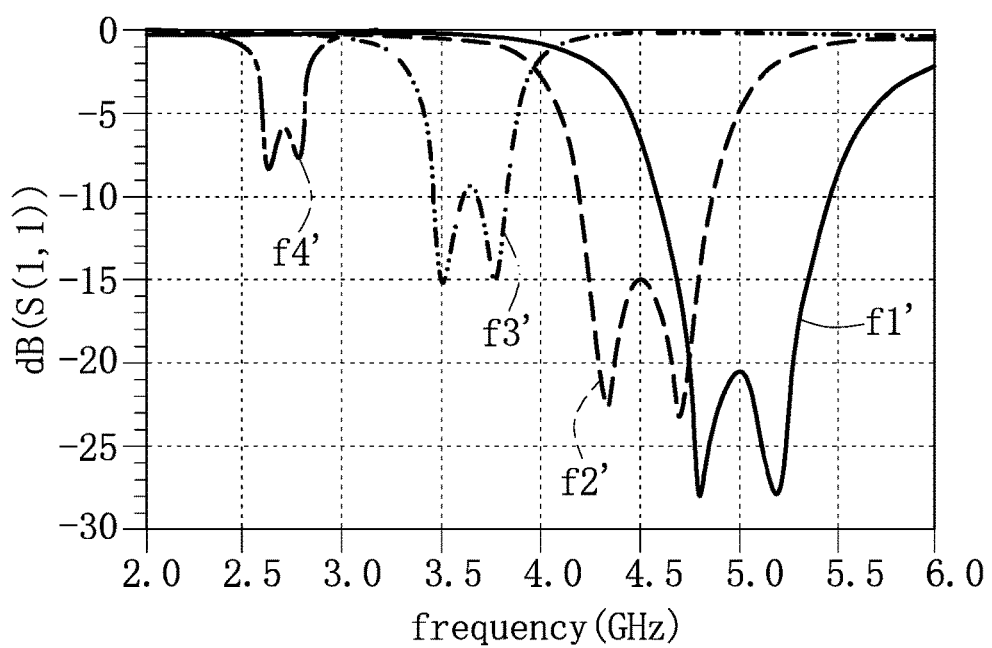

FIG. 3A and FIG. 3B show transmission characteristic of a tunable filter according to one embodiment of the present disclosure.

The curves f1, f2, f3 and f4 in FIG. 3A show the insertion loss (i.e. the parameter S21) of the tunable filter with center frequency respectively at 5 GHz, 4.5 GHz, 3.5 GHz and 2.5 GHz. In addition, the curves f1', f2', f3' and f4' in FIG. 3B show the return loss (i.e. the parameter S11) of the tunable filter with center frequency respectively at 5 GHz, 4.5 GHz, 3.5 GHz and 2.5 GHz.

As shown in FIG. 3A, when only the capacitance of the first capacitor C1 of the first circuit 10 and the capacitance of the first capacitor C1 of the second circuit 20 are tuned for adjusting the center frequency of the tunable filter from 5 GHz to 2.5 GHz, the curve representing the insertion loss of the tunable filter is changed from the curve f1 to the curve f4. Therefore, it is shown that, the quality factor of the tunable filter cannot be maintained after the capacitance of the first capacitor C1 of the first circuit 10 and the capacitance of the first capacitor C1 of the second circuit 20 are tuned for adjusting the center frequency of the tunable filter from 5 GHz to 2.5 GHz, so that the insertion loss of the tunable filter gradually increases.

To compensate for the variation of the quality factor (or to reduce the increase of the insertion loss) caused by tuning the capacitance of the first capacitor C1 of the first circuit 10 and the capacitance of the first capacitor C1 of the second circuit 20, in this embodiment, the first coupling capacitor Cx and the third coupling capacitor Cz are designed as variable capacitors. The increase of the insertion loss of the tunable filter can be decreased by tuning the capacitances of the first coupling capacitor Cx and the third coupling capacitor Cz. In other words, the capacitances of the first coupling capacitor Cx and the third coupling capacitor Cz are relevant to the insertion loss of the tunable filter.

It is worth mentioning that, in other embodiments, variable capacitors can be connected externally respectively to the first coupling capacitor Cx and the third coupling capacitor Cz, such that the capacitances of the first coupling capacitor Cx and the third coupling capacitor Cz can be tuned. However, the present disclosure is not limited thereto.

Figure 4A:
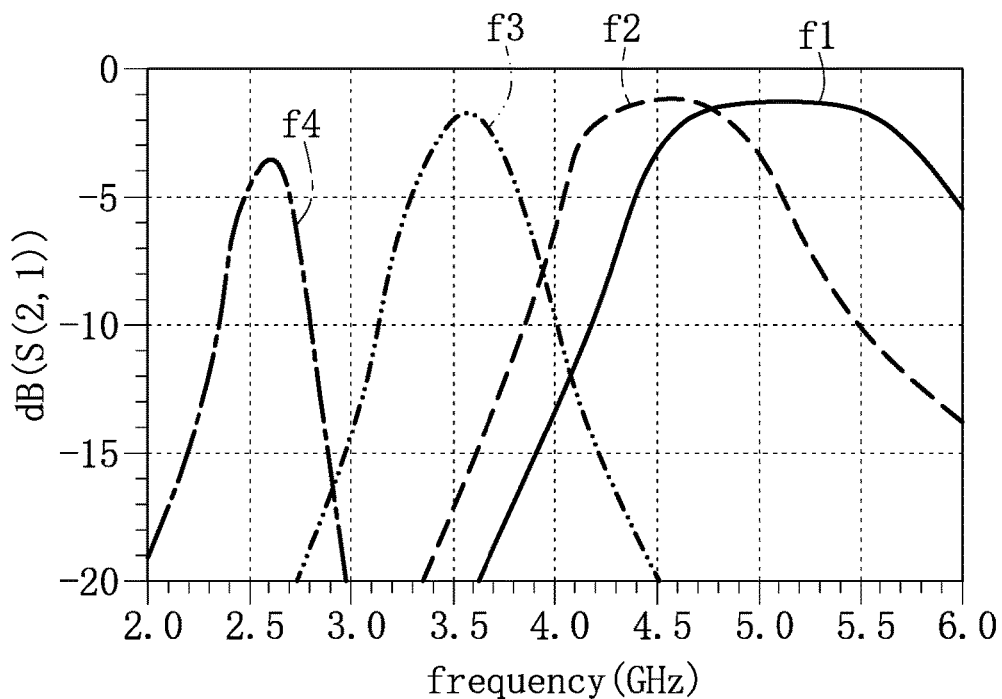
FIG. 4A and FIG. 4B show transmission characteristic of a tunable filter according to another embodiment of the present disclosure.
Figure 4B:
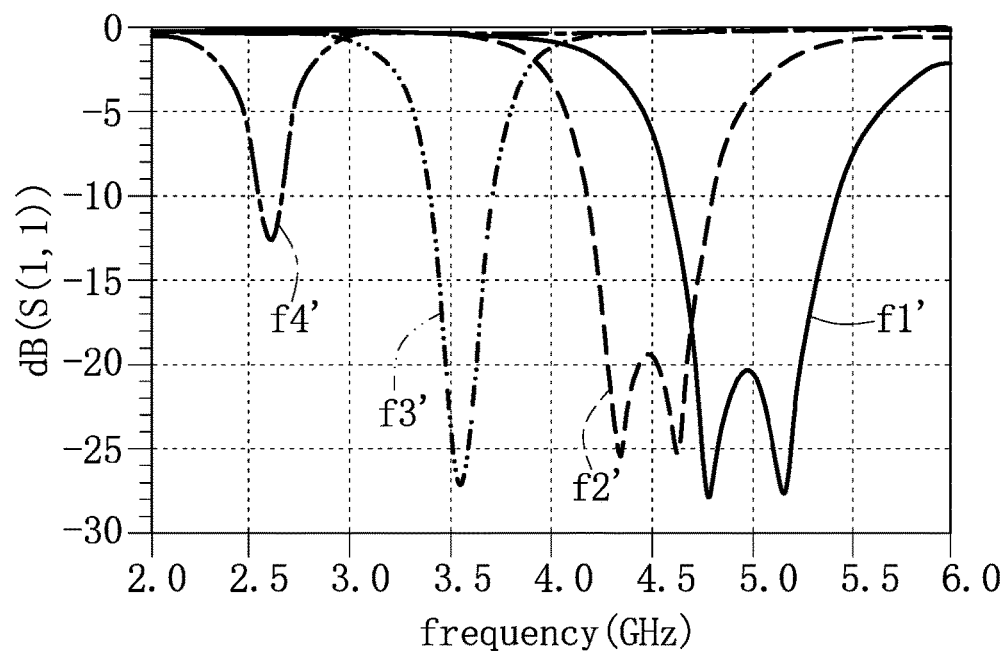

FIG. 4A and FIG. 4B show transmission characteristic of a tunable filter according to another embodiment of the present disclosure.

The curves f1, f2, f3 and f4 in FIG. 4A show the insertion loss (i.e. the parameter S21) of the tunable filter with center frequency respectively at 5 GHz, 4.5 GHz, 3.5 GHz and 2.5 GHz after the capacitances of the first coupling capacitor Cx and the third coupling capacitor Cz are tuned. In addition, the curves f1', f2', f3' and f4' in FIG. 4B show the return loss (i.e. the parameter S11) of the tunable filter with center frequency respectively at 5 GHz, 4.5 GHz, 3.5 GHz and 2.5 GHz after the capacitances of the first coupling capacitor Cx and the third coupling capacitor Cz are tuned.

Comparing FIG. 3A and FIG. 4A, it can be seen that, the tunable filters with different center frequencies can have less insertion loss by tuning the capacitances of the first coupling capacitor Cx and the third coupling capacitor Cz. In other words, although the insertion loss will increase because the capacitance of the first capacitor C1 of the first circuit 10 and the capacitance of the first capacitor C1 of the second circuit 20 are tuned, the increase of the insertion loss can be reduced by tuning the capacitances of the first coupling capacitor Cx and the third coupling capacitor Cz.

However, comparing FIG. 3B and FIG. 4B, it can be seen that, the return loss of the tunable filer will vary because the capacitances of the first coupling capacitor Cx and the third coupling capacitor Cz are tuned for reducing the insertion loss of the tunable filer. Assuming that, the initial center frequency of the tunable filter is 5 GHz, it can be observed from FIG. 3B and FIG. 4B that the variation of the return loss of the tunable filer becomes more apparent when the center frequency of the tunable filter is away from 5 GHz.

To make the fractional bandwidth of the tunable filter be 10% and the return loss of the tunable filter is less than or equal to −15 dB at different center frequencies, in this embodiment, the second coupling capacitor Cy is designed as a variable capacitor. When the return loss of the tunable filter is less than or equal to −15 dB, the fractional bandwidth of the tunable filter can be maintained at 10% by tuning the capacitance of the second coupling capacitor Cy. In other words, the capacitance of the second coupling capacitor Cy is relevant to the return loss of the tunable filter.

It is worth mentioning that, in other embodiments, a variable capacitor can be connected externally to the second coupling capacitor Cy, such that the capacitance of the second coupling capacitor Cy can be tuned. However, the present disclosure is not limited thereto.

Figure 5A:
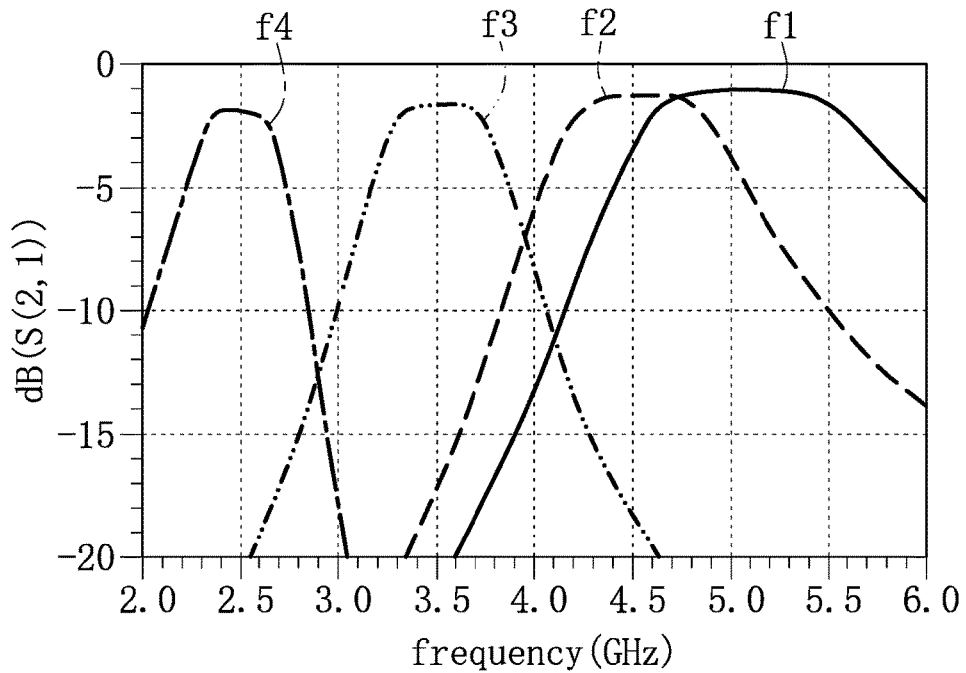
FIG. 5A and FIG. 5B show transmission characteristic of a tunable filter according to still another embodiment of the present disclosure.
Figure 5B:
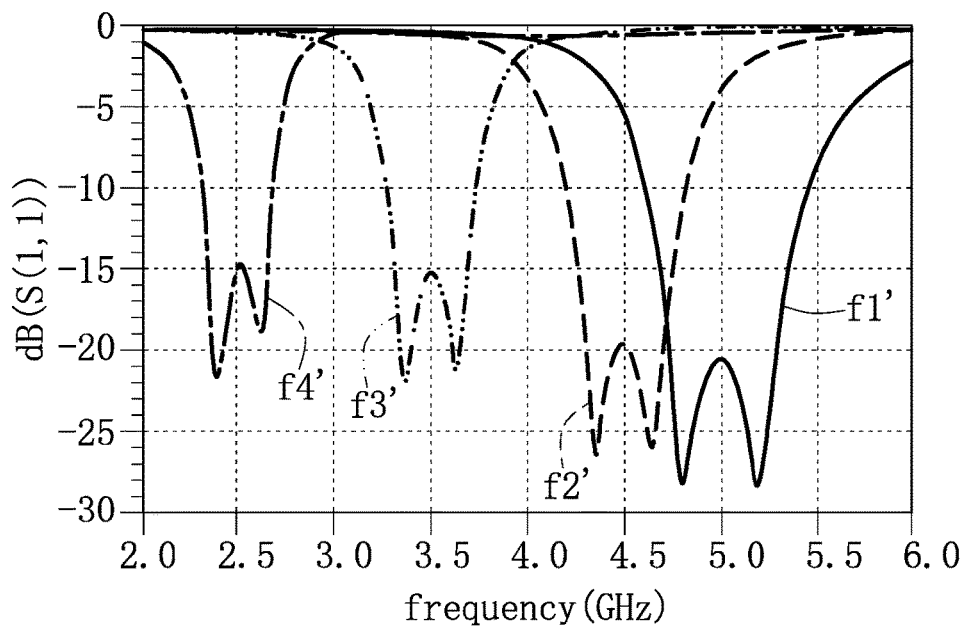

FIG. 5A and FIG. 5B show transmission characteristic of a tunable filter according to still another embodiment of the present disclosure.

The curves f1, f2, f3 and f4 in FIG. 5A show the insertion loss (i.e. the parameter S21) of the tunable filter with center frequency respectively at 5 GHz, 4.5 GHz, 3.5 GHz and 2.5 GHz after the capacitance of the second coupling capacitor Cy is tuned. In addition, the curves f1', f2', f3' and f4' in FIG. 5B show the return loss (i.e. the parameter S11) of the tunable filter with center frequency respectively at 5 GHz, 4.5 GHz, 3.5 GHz and 2.5 GHz after the capacitance of the second coupling capacitor Cy is tuned.

Comparing FIG. 4B and FIG. 5B, by tuning the capacitance of the second coupling capacitor Cy, the fractional bandwidth of the tunable filter can be maintained at 10% and the return loss of the tunable filter is less than or equal to −15 dB. Thus, although the return loss of the tunable filter will vary because the capacitances of the first coupling capacitor Cx and the third coupling capacitor Cz are tuned, by tuning the capacitance of the second coupling capacitor Cy, the fractional bandwidth of the tunable filter can still be maintained at 10% and the return loss of the tunable filter is less than or equal to −15 dB. In short, to tune the capacitance of the second coupling capacitor Cy is to adjust the bandwidth of the tunable filter.

Figure 6:
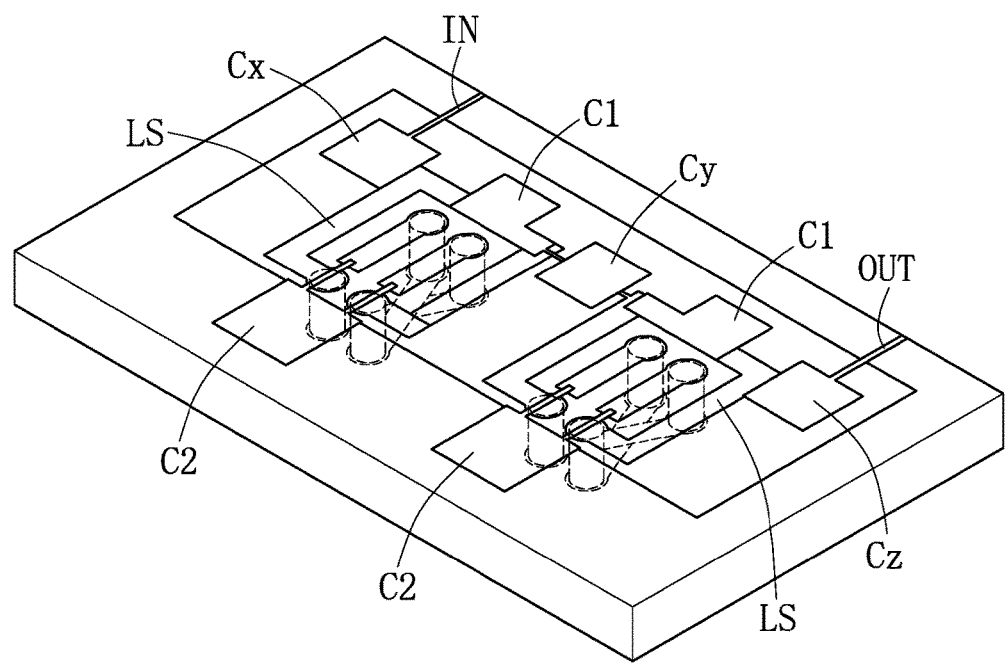
FIG. 6 shows a perspective drawing of a tunable filter according to one embodiment of the present disclosure.

The structure of the tunable filter is described in the following descriptions. Referring to FIG. 6, a perspective drawing of a tunable filter according to one embodiment of the present disclosure is shown.

In this embodiment, the tunable filter is configured on multi-layered substrates. As shown in FIG. 6, the input end IN and the output end OUT of the tunable filter, the first capacitor C1, the second capacitor C2, the first inductor L1 and the second inductor L2 of the first circuit 10, the first capacitor C1, the second capacitor C2, the first inductor L1 and the second inductor L2 of the second circuit 20, the first coupling capacitor Cx, the second coupling capacitor Cy and the third coupling capacitor Cz are configured on the multi-layered substrates.

Specifically, the tunable filter has a three-dimensional (3D) circuit structure. The first capacitor C1 and the second capacitor C2 of the first circuit 10, the first capacitor C1 and the second capacitor C2 of the second circuit 20, the first coupling capacitor Cx, the second coupling capacitor Cy and the third coupling capacitor Cz are all implemented by a parallel-plate capacitor connected with a variable capacitor in parallel. Additionally, the first inductor L1 and the second inductor L2 of the first circuit 10 and the first inductor L1 and the second inductor L2 of the second circuit 20 are all implemented by a 3D inductor.

For ease of illustration, the tunable filter in this embodiment has, for example, four layers substrates. How the input end IN and the output end OUT of the tunable filter, the first capacitor C1, the second capacitor C2, the first inductor L1 and the second inductor L2 of the first circuit 10, the first capacitor C1, the second capacitor C2, the first inductor L1 and the second inductor L2 of the second circuit 20, the first coupling capacitor Cx, the second coupling capacitor Cy and the third coupling capacitor Cz are configured on these four layers substrates is shown in FIG. 6. However, FIG. 6 shows only an example to illustrate how the capacitors and the inductors may be configured on these substrates, and thus the present disclosure is not limited thereto.

As shown in FIG. 6, the first inductor L1 and the second inductor L2 of the first circuit 10 compose a 3D inductor structure LS, and this 3D inductor structure LS is configured at the second layer, the third layer and the fourth layer of substrates. In addition, the first inductor L1 and the second inductor L2 of the second circuit 20 also compose a 3D inductor structure LS, and this 3D inductor structure LS is also configured at the second layer, the third layer and the fourth layer of substrates. Moreover, the input end IN and the output end OUT of the tunable filter, the first capacitor C1 and the second capacitor C2 of the first circuit 10, the first capacitor C1 and the second capacitor C2 of the second circuit 20, the first coupling capacitor Cx, the second coupling capacitor Cy and the third coupling capacitor Cz are configured at the first layer and the second layer of substrates.

It is worth mentioning that, the 3D inductor has less metal loss, and thus, compared with the planar inductor, the tunable filter in this embodiment can have less insertion loss and less return loss by using the 3D inductor.

Figure 7:
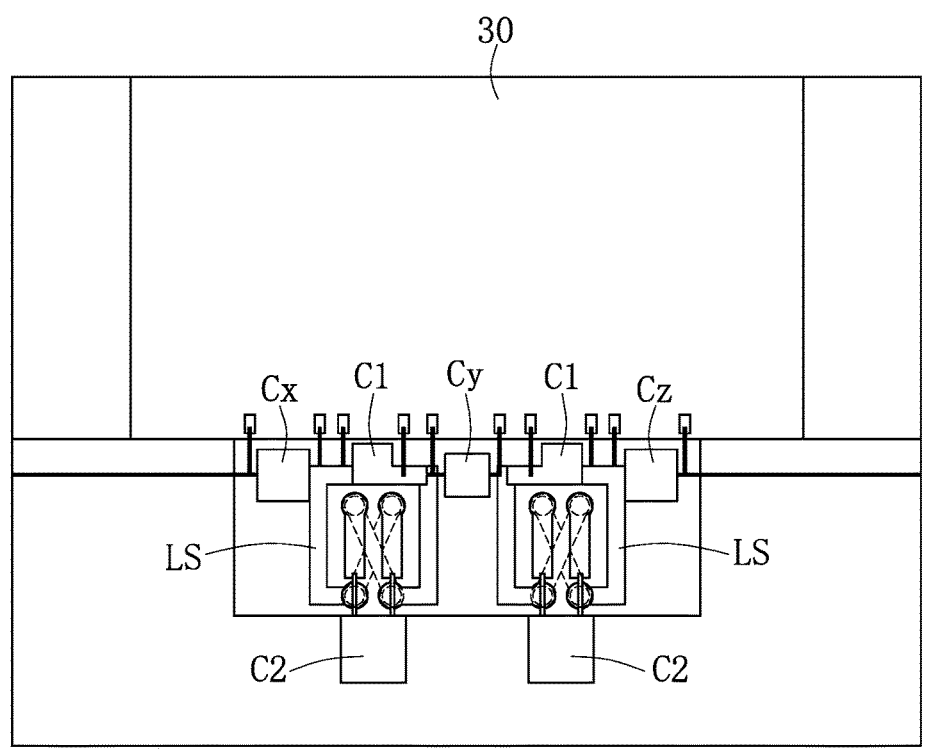
FIG. 7 is a schematic diagram showing that a tunable filter is connected to a chip according to one embodiment of the present disclosure.

FIG. 7 is a schematic diagram showing that a tunable filter is connected to a chip according to one embodiment of the present disclosure.

As shown in FIG. 7, to make the tunable filter connect to a chip 30, each of the first capacitor C1 of the first circuit 10, the first capacitor C1 of the second circuit 20, the first coupling capacitor Cx, the second coupling capacitor Cy and the third coupling capacitor Cz is connected to the chip 30 through two connecting wires. It should be noted that, in one embodiment, if the capacitances of the first capacitor C1 and the second capacitor C2 of the first circuit 10, the first capacitor C1 and the second capacitor C2 of the second circuit 20, the first coupling capacitor Cx, the second coupling capacitor Cy and the third coupling capacitor Cz are tuned through their external variable capacitors, each of these external variable capacitors should be connected to the chip 30 through two connecting wires.

To sum up, in the present disclosure, the center frequency of the tunable filter can be adjusted by tuning the capacitances of the first capacitor of the first circuit and the first capacitor of the second circuit. In addition, by tuning the capacitances of the first coupling capacitor and the third coupling capacitor, the increase of the insertion loss caused after the capacitances of the first capacitor of the first circuit and the first capacitor of the second circuit are tuned can be compensated. Moreover, the bandwidth of the tunable filter can be adjusted by tuning the capacitance of the second coupling capacitor, such that the fractional bandwidth of the tunable filter can be maintained at 10% and the return loss of the tunable filter is less than or equal to −15dB.

Therefore, even if the center frequency of the tunable filter is adjusted within a larger frequency range (e.g. a frequency range defined by 50% of the initial center frequency), the insertion loss will not increase too significantly, such that the tunable filter can always work normally. Also, the return loss can be controlled such that the factional bandwidth of the tunable filter can be maintained at 10% and the return loss of the tunable filter is less than or equal to −15 dB.

Additionally, rather than designing the tunable filter with planar inductors, the tunable filter of the present disclosure is designed with 3D inductors, so that the tunable filter provided by the present disclosure has less insertion loss and less return loss.

The descriptions illustrated supra set forth simply the preferred embodiments of the present disclosure; however, the characteristics of the present disclosure are by no means restricted thereto. All changes, alterations, or modifications conveniently considered by those skilled in the art are deemed to be encompassed within the scope of the present disclosure delineated by the following claims.

What is claimed is:

1. A tunable filter, having an input end and an output end, comprising:
   a first circuit and a second circuit, wherein both of the first circuit and the second circuit include:
   a first tunable capacitor, having a first end and a second end;
   a first inductor and a second inductor, wherein the first inductor and the second inductor are connected in serial and further connected with the first tunable capacitor in parallel, and a mutual induction is generated between the first inductor and the second inductor; and
   a second tunable capacitor, having a first end and a second end, wherein the first end of the second tunable capacitor is connected between the first inductor and the second inductor, and the second end of the second tunable capacitor is grounded;
   wherein the first end of the first tunable capacitor of the first circuit is coupled to the input end of the tunable filter through a first coupling tunable capacitor, the second end of the first tunable capacitor of the first circuit is coupled to the first end of the first tunable capacitor of the second circuit through a second coupling tunable capacitor, and the second end of the first tunable capacitor of the second circuit is coupled to the output end of the tunable filter through a third coupling tunable capacitor;
   wherein a ratio of a capacitance of the first tunable capacitor to a capacitance of the second tunable capacitor is 0.08~0.12 in the first circuit, and a ratio of a capacitance of the first tunable capacitor to a capacitance of the second tunable capacitor is 0.08~0.12 in the second circuit.

2. The tunable filter according to claim 1, having multi-layered substrates, wherein the input end and the output end of the tunable filter, the first tunable capacitor, the second tunable capacitor, the first inductor and the second inductor of the first circuit, the first tunable capacitor, the second tunable capacitor, the first inductor and the second inductor of the second circuit, the first coupling tunable capacitor, the second coupling tunable capacitor and the third coupling tunable capacitor are configured on the multi-layered substrates.

3. The tunable filter according to claim 1, wherein the capacitances of the first tunable capacitor and the second tunable capacitor of the first circuit are related to a center frequency of the tunable filter, and the capacitances of the first tunable capacitor and the second tunable capacitor of the second circuit are related to the center frequency of the tunable filter.

4. The tunable filter according to claim 1, wherein a coefficient of the mutual induction between the first inductor and the second inductor of the first circuit is 0.3~0.5, and a coefficient of the mutual induction between the first inductor and the second inductor of the second circuit is 0.3~0.5.

5. The tunable filter according to claim 1, wherein the capacitances of the first coupling tunable capacitor and the third coupling tunable capacitor are related to an insertion loss of the tunable filter.

6. The tunable filter according to claim 1, wherein the capacitance of the second coupling tunable capacitor is related to a return loss of the tunable filter.

* * * * *